(12) United States Patent
Zhou et al.

(10) Patent No.: US 11,869,760 B1
(45) Date of Patent: Jan. 9, 2024

(54) POWER ELECTRONIC DEVICE ASSEMBLIES HAVING AN ELECTRICALLY INSULATING LAYER

(71) Applicant: Toyota Motor Engineering & Manufacturing North America, Inc., Plano, TX (US)

(72) Inventors: Feng Zhou, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 17/874,488

(22) Filed: Jul. 27, 2022

(51) Int. Cl.
*H05K 7/20* (2006.01)
*H05K 1/02* (2006.01)
(Continued)

(52) U.S. Cl.
CPC ....... *H01L 23/3735* (2013.01); *H05K 1/0206* (2013.01); *H05K 1/185* (2013.01);
(Continued)

(58) Field of Classification Search
CPC ... H01L 23/3107; H01L 23/34; H01L 23/345; H01L 23/36; H01L 23/367; H01L 23/3672; H01L 23/3675; H01L 23/3677; H01L 23/373; H01L 23/3735; H01L 23/3736; H01L 23/38; H01L 23/2012; H01L 23/42; H01L 23/4334; H01L 23/467; H01L 23/473; H01L 23/49567; H01L 23/49827; H01L 23/522; H01L 24/32; H01L 24/49; H01L 25/072; H01L 29/1602; H01L 29/1608; H01L 29/2003; H01L 29/41741; H01L 2224/32221; H01L 2224/48091; H01L 2224/48106; H01L 2224/48221; H01L 2224/48225; H01L 2224/49827;
(Continued)

(56) References Cited

U.S. PATENT DOCUMENTS

2015/0262904 A1* 9/2015 Hung .................. H01L 25/0657 257/713
2018/0211899 A1* 7/2018 Morianz ................ H01L 24/20
(Continued)

FOREIGN PATENT DOCUMENTS

CN 206136549 U 4/2017
CN 213244488 U 5/2021
(Continued)

*Primary Examiner* — Amir A Jalali
(74) *Attorney, Agent, or Firm* — DINSMORE & SHOHL LLP

(57) ABSTRACT

Power electronics device assemblies, circuit board assemblies, and power electronics assemblies are disclosed. In one embodiment, a power electronics device assembly includes an S-cell including a first metal layer, a first graphite layer bonded to the first metal layer, an electrically insulating layer bonded to the first graphite layer, a second graphite layer bonded to the electrically insulating layer and a second metal layer bonded to the second graphite layer, the second metal layer comprising a surface and a recess provided within the surface. The power electronics device assembly further includes a power electronics device disposed within the recess of the surface.

20 Claims, 5 Drawing Sheets

(51) Int. Cl.
  *H05K 1/18*   (2006.01)
  *H01L 23/373*   (2006.01)
  *H01L 25/07*   (2006.01)
(52) U.S. Cl.
  CPC ........ *H05K 7/20254* (2013.01); *H01L 25/072* (2013.01); *H05K 2201/10166* (2013.01); *H05K 2201/10522* (2013.01)
(58) Field of Classification Search
  CPC ... H01L 2225/06589; H01L 2225/1094; H01L 2924/0272; H01L 2924/10254; H01L 2924/10323; H01L 2924/10325; H01L 2924/1033; H01L 2924/13055; H01L 2924/13091; H01L 2924/1426; H05K 1/0201; H05K 1/0203; H05K 1/0204; H05K 1/0272; H05K 1/0206; H05K 1/185; H05K 7/20218; H05K 7/20154; H05K 7/20254; H05K 7/2029; H05K 7/20509; H05K 7/20627; H05K 7/20763; H05K 7/20845; H05K 7/2089; H05K 7/209; H05K 7/20918; H05K 2201/064; H05K 2201/09036; H05K 2201/10166; H05K 2201/10522
  See application file for complete search history.

(56) References Cited

U.S. PATENT DOCUMENTS

| | | | |
|---|---|---|---|
| 2020/0295474 A1* | 9/2020 | Vockenberger | H05K 1/115 |
| 2021/0195798 A1* | 6/2021 | Neal | H01L 23/3675 |
| 2022/0015236 A1* | 1/2022 | Huang | H01L 21/56 |
| 2022/0053634 A1* | 2/2022 | Zhou | H01L 23/427 |
| 2022/0328411 A1* | 10/2022 | Or-Bach | H01L 27/092 |
| 2022/0408554 A1* | 12/2022 | Tseng | H01L 23/49827 |
| 2023/0247807 A1* | 8/2023 | Zhou | H05K 7/20509 |
| | | | 361/711 |

FOREIGN PATENT DOCUMENTS

| | | |
|---|---|---|
| CN | 215683018 U | 1/2022 |
| CN | 216015351 U | 3/2022 |
| WO | 2021241951 A1 | 12/2021 |
| WO | 2022005183 A1 | 1/2022 |

* cited by examiner

POWER ELECTRONIC DEVICE ASSEMBLIES HAVING AN ELECTRICALLY INSULATING LAYER

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, a power electronics device assembly includes an S-cell including a first metal layer, a first graphite layer bonded to the first metal layer, an electrically insulating layer bonded to the first graphite layer, a second graphite layer bonded to the electrically insulating layer and a second metal layer bonded to the second graphite layer, the second metal layer comprising a surface and a recess provided within the surface. The power electronics device assembly further includes a power electronics device disposed within the recess of the surface.

In another embodiment, a circuit board assembly includes a substrate that is electrically insulating, and a power electronics device assembly fully embedded in the substrate. The power electronics device assembly includes an S-cell including a first metal layer, a first graphite layer bonded to the first metal layer, an electrically insulating layer bonded to the first graphite layer, a second graphite layer bonded to the electrically insulating layer and a second metal layer bonded to the second graphite layer, the second metal layer comprising a surface and a recess provided within the surface. The power electronics device assembly further includes a power electronics device disposed within the recess of the surface.

In yet another embodiment, a power electronics assembly includes a cold plate and a circuit board assembly affixed to a first surface of the cold plate. The circuit board assembly includes a substrate that is electrically insulating and a power electronics device assembly fully embedded in the substrate. The power electronics assembly includes an S-cell including a first metal layer, a first graphite layer bonded to the first metal layer, an electrically insulating layer bonded to the first graphite layer, a second graphite layer bonded to the electrically insulating layer and a second metal layer bonded to the second graphite layer, the second metal layer comprising a surface and a recess provided within the surface. The power electronics device assembly further includes a power electronics device disposed within the recess of the surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
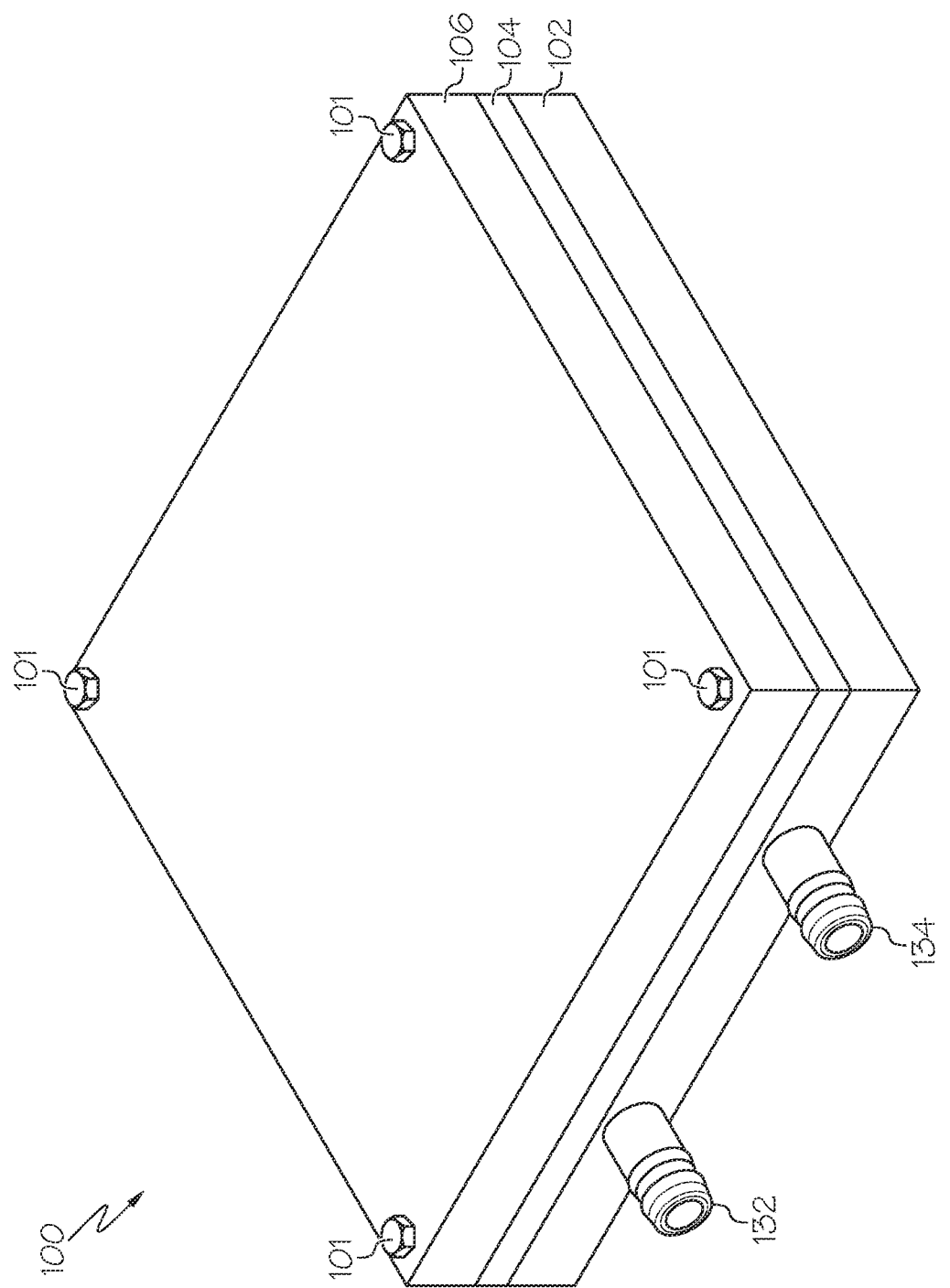
FIG. 1 schematically depicts a perspective view of a power electronics assembly according to one or more embodiments described and illustrated herein.

Embodiments described herein are generally directed to power electronics assemblies having one or more power electronics device assemblies embedded directly into a circuit board, such as a printed circuit board. By fully embedding the one or more power electronics device assemblies in the circuit board, an electrical insulation layer between the circuit board and a cold plate of the power electronics assembly may be removed because the power electronics devices are insulated by the substrate material of the circuit board (e.g., FR-4). Removal of the electrical insulation layer reduces the thermal resistance between the power electronics devices and the cold plate, thereby improving thermal performance. Further, removal of the electrical insulation layer also reduces the overall package size of the power electronics device assembly.

The power electronics device assemblies of the present disclosure comprise a power electronics device affixed to a mounting substrate referred to herein as an S-cell. As described in more detail below, the S-cell includes an electrically insulating layer that electrically insulates the bottom electrodes of the power electronics device from other components of the power electronics device assembly. For example, the integral electrically insulating layer of the S-cell enables the removal of the electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein comprise stacked metal, graphite, and one or more electrically insulating layers in a compact package.

The power electronic device assemblies, the circuit board assemblies, and the power electronics assemblies described herein may be used in electrified vehicles, such as and without being limited to, an electric vehicle, a hybrid electric vehicle, any electric motor, generators, industrial tools, household appliances, and the like. The power electronics assemblies described herein may be electrically coupled to an electric motor and/or a battery and be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device and includes one or more of a metal layer, a graphite layer and an electrically insulating layer.

Various embodiments of power electronics device assemblies, circuit board assemblies, and power electronics assemblies are described in detail below. Whenever possible, the same reference numerals will be used throughout the drawings to refer to the same or like parts.

Figure 2:
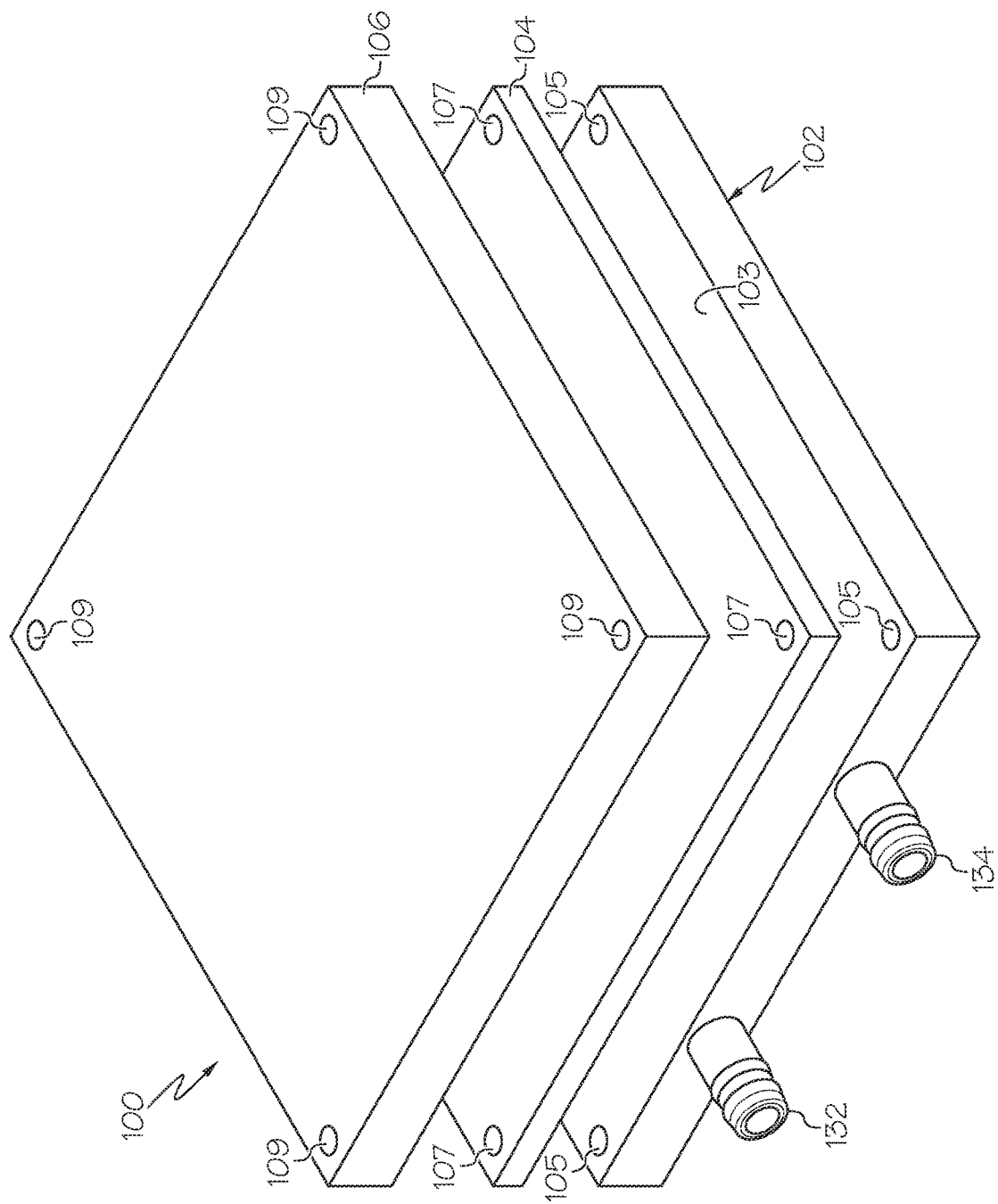
FIG. 2 schematically depicts an exploded perspective view of the example power electronics assembly illustrated by FIG. 1 according to one or more embodiments described and illustrated herein.
Figure 3:
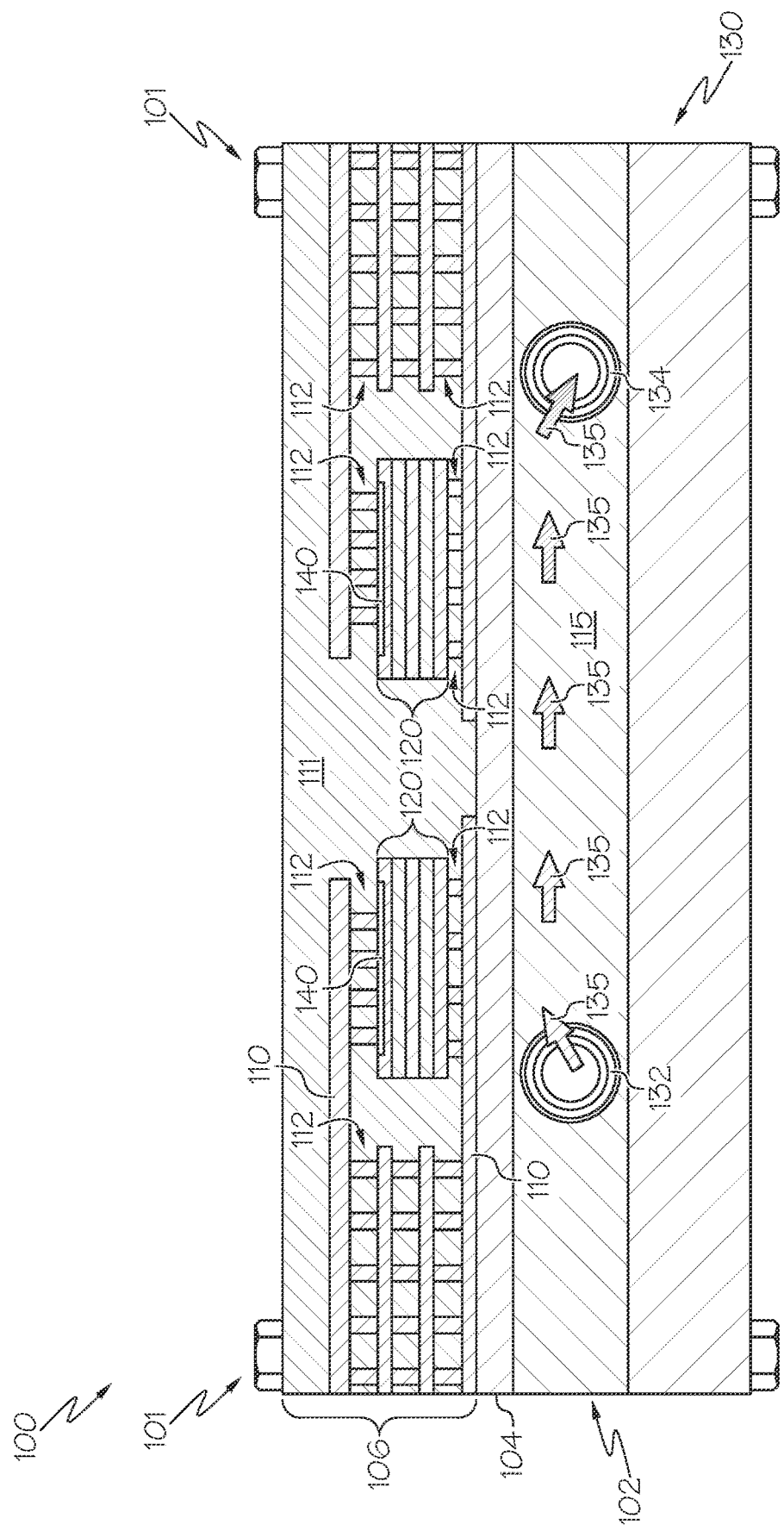
FIG. 3 schematically depicts a cross-sectional view of an example power electronics assembly according to one or more embodiments described and illustrated herein.

Referring now to FIGS. 1 and 2, an example power electronics assembly 100 is illustrated in an assembled view and an exploded view, respectively. The power electronics assembly 100 illustrated by FIGS. 1 and 2 include a cold plate 102, a bond layer 104 (or in some embodiments a thermal grease layer), and a circuit board assembly 106. The cold plate 102 may be any device capable of removing heat flux from power electronics devices 140 (see FIG. 3) embedded within a substrate material of the circuit board assembly 106. Non-limiting examples for the cold plate include heat sinks, single-phase liquid cooling, two-phase liquid cooling, a vapor chambers. FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 within the cold plate 102. Referring briefly to FIG. 3, cooling fluid 135 from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135.

The circuit board assembly 106 is affixed to a first surface 103 of the cold plate 102. FIGS. 1 and 2 illustrate the circuit board assembly 106 as being affixed to the first surface 103 of the cold plate 102 by way of fasteners 101 (e.g., bolts and nuts) disposed through through-holes 105 of the cold plate 102, through-holes 107 of the bond layer 104, and through-holes of the circuit board assembly 106. When fasteners 101 are used, the bond layer 104 may be a thermal grease layer to lower the thermal resistance between the circuit board assembly 106 and cold plate 102. It is noted that the bond layer 104 configured as thermal grease will not have dedicated through-holes; through-holes 107 are shown for illustrative purposes.

In other embodiments, the circuit board assembly 106 is affixed to the first surface 103 of the cold plate 102 by a bond layer 104 configured as a solder layer. For example, the bottom surface of the circuit board assembly 106 may include a metal layer that enables the circuit board assembly 106 to be affixed to the first surface 103 of the cold plate 102 by a solder layer. It should be understood that other bonding methods may be utilized.

Referring now to FIG. 3, a cross-sectional view of the example power electronics assembly 100 is illustrated. In the illustrated embodiment, an additional electrical component 130 is affixed to a second surface of the cold plate 102. As a non-limiting example, the additional electrical component 130 may be a capacitor of an inverter circuit, for example. It should be understood that an additional electrical component 130 may not be affixed to the cold plate 102 in other embodiments.

The circuit board assembly 106 comprises a substrate 111 made of an electrically insulating material. The electrically insulating material may be a material used in the fabrication of printed circuit boards, such as, without limitation, FR-4. The circuit board assembly 106 further comprises embedded electrically conductive layers 110, a plurality of vias 112 (both electrically conducting vias and thermal vias), and a plurality of power electronics device assemblies 120.

As a non-limiting example the circuit board assembly 106 may include six power electronics device assemblies 120 for an inverter circuit for an electric vehicle. However, it should be understood that any number of power electronics device assemblies may be utilized depending on the application.

Each power electronics device assembly 120 includes an S-cell 121 and a power electronics device 140 affixed to the S-cell 121. As stated above, the S-cell 121 is a substrate to which the power electronics device 140 is bonded. It provides electrically conductive surface area to make connections to electrodes on the bottom surface of the power electronics device 140. The S-cell 121 further provides heat spreading functionality as well as electrical isolation. By providing electrical isolation in the S-cell 121, a separate electrical isolation layer between the circuit board assembly 106 and the cold plate 102 is not needed.

Figure 4:
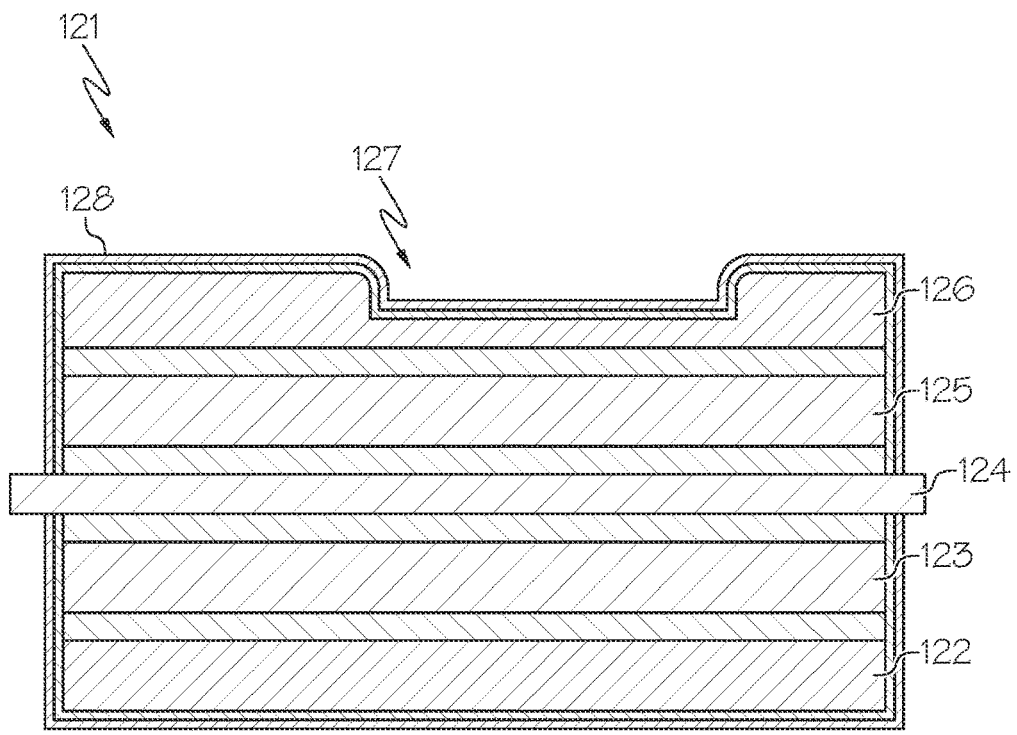
FIG. 4 schematically illustrates a cross-sectional view of an example S-cell according to one or more embodiments described and illustrated herein.
Figure 5:
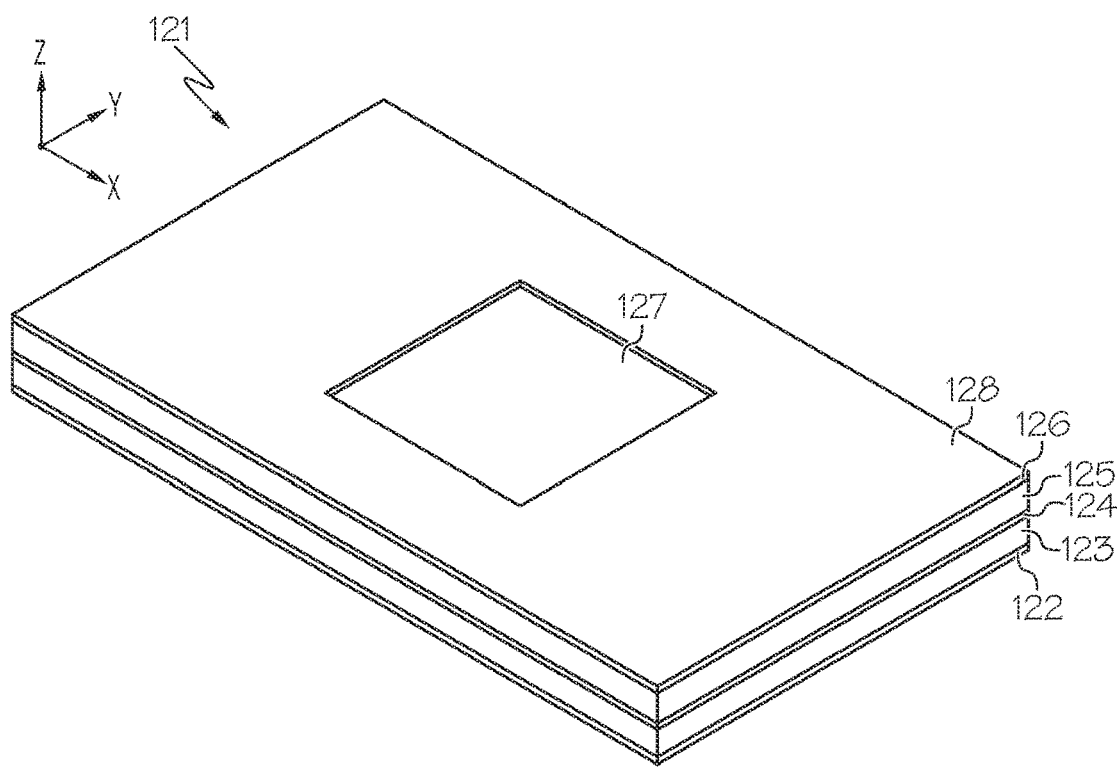
FIG. 5 schematically illustrates a top perspective view of an example S-cell according to one or more embodiments described and illustrated herein.

FIGS. 4 and 5 illustrate an example S-cell 121 in a cross-sectional view and a top perspective view, respectively. The S-cell 121 includes a plurality of stacked layers. Particularly, the S-cell 121 illustrated by FIGS. 4 and 5 include a first metal layer 122, a first graphite layer 123, an electrically insulating layer 124, a second graphite layer 125, and a second metal layer 126. The second metal layer 126 includes a recess 127 having dimensions to receive a power electronics device 140. As described in more detail below, the second metal layer 126 provides an electrically conductive surface to which electrically conductive vias may contact to make an electrical connection to electrodes on a bottom surface of the power electronics device 140.

As a non-limiting example, the layers of the S-cell may be bonded together by a high-temperature active metal brazing method that forms bond layers 129 (i.e., active metal brazing layers). However, it should be understood that the various layers may be bonded using other known and yet-to-be-developed techniques.

It is noted that the illustrated S-cell 121 includes a pair of graphite layers (i.e., first graphite layer 123 and second graphite layer 125) and a pair of metal layers (i.e., first metal layer 122 and second metal layer 126) to provide an S-cell 121 that is symmetrical along a z-axis. The symmetrical nature of the S-cell 121 balances forces on the S-cell during the high-temperature bonding process. Because the first and second metal layers 122, 126 and the first and second graphite layers 123, 125 have different coefficients of thermal expansion, it may be desirable to have a symmetrical substrate stack to balances the thermally induced stresses during the bonding process.

The first and second metal layers 122, 126 may be made of any suitable metal or alloy. Copper and aluminum may be used as the first and second metal layers 122, 126 as non-limiting examples.

The first and second graphite layers 123, 125 are provided to encourage heat spreading both across the S-cell 121 as well as toward the cold plate 102. The crystalline structure of graphite provides it with high thermal conductivity making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is larger than its width dimension. Referring to FIG. 5, the first and second graphite layers 123, 124 have high thermal conductivity along the x-axis and the z-axis. Thus, the S-cell 121 is designed such that its dimension along the x-axis is larger than its dimension along the y-axis. Heat flux will travel along the x- and z-axis. As described in more detail below, thermal vias may be provided at the edges of the S-cell along the x-axis to receive heat flux and move it toward the cold plate 102. Heat flux will also travel along the z-axis toward the cold plate 102.

The electrically insulating layer 124 may be made of any material capable of providing electrical insulation between the first metal layer 122 and the second metal layer 126. As a non-limiting example, the electrically insulating layer 124 may be made of a ceramic material, such as silicon nitride or aluminum nitride. The material chosen for the electrically insulating layer 124 should have a high thermal conductivity so that heat flux may flow through the electrically insulating layer 124 toward the cold plate 102.

In some embodiments, the electrically insulating layer 124 has a larger surface area than the other layers in the stack such that it extends out beyond an edge of the S-cell 121 formed by the first and second metal layers 122, 126 and the first and second graphite layers 123, 125. Extending the electrically insulating layer 124 beyond the electrically conductive layers reduces creep voltage and current leakage along the edge of the S-cell 121. However, because the S-cell 121 is embedded in the electrically insulating material of the circuit board, the S-cell 121 may have electrical isolation sufficient enough without the electrically insulating layer 124 being larger in surface area than the other electrically conductive layers.

The second metal layer 126 has a recess 127 formed in its surface 128. The recess 127 may be formed by chemical etching, for example. The recess 127 has a size and shape to accept a power electronics device 140.

Figure 6:
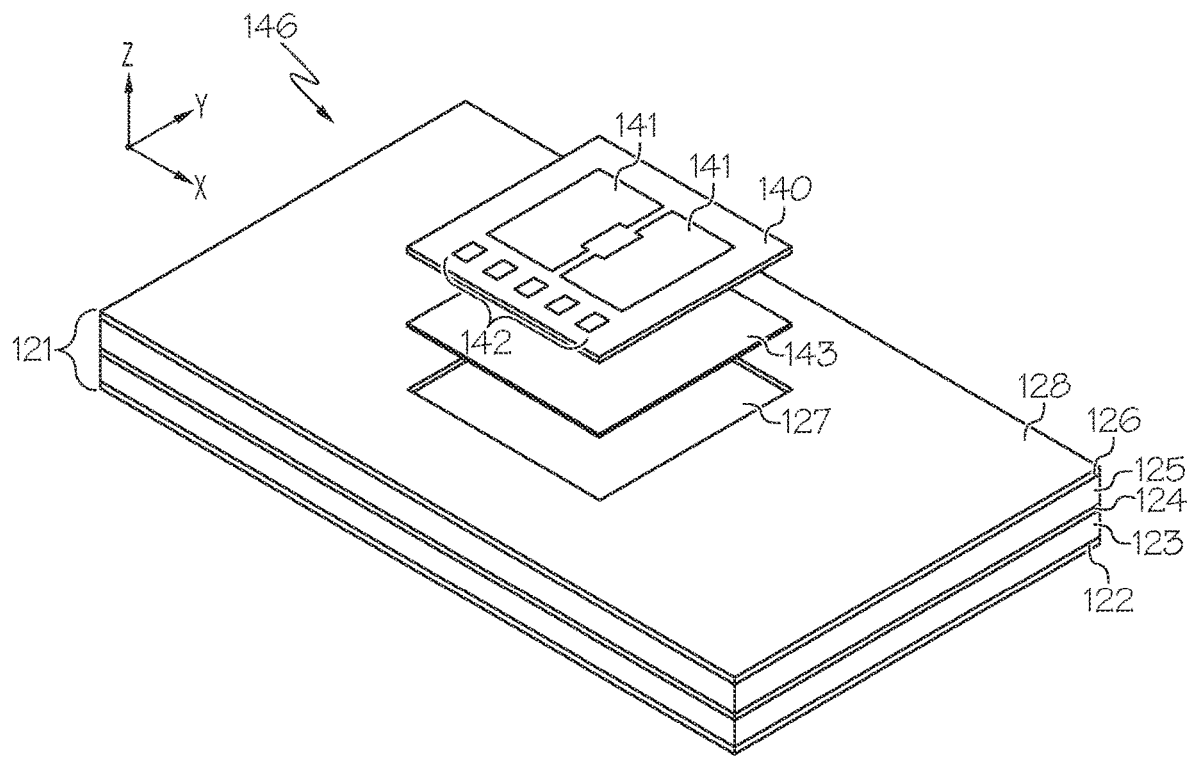
FIG. 6 schematically illustrates an exploded perspective view of an example power electronics device assembly according to one or more embodiments described and illustrated herein.
Figure 7:
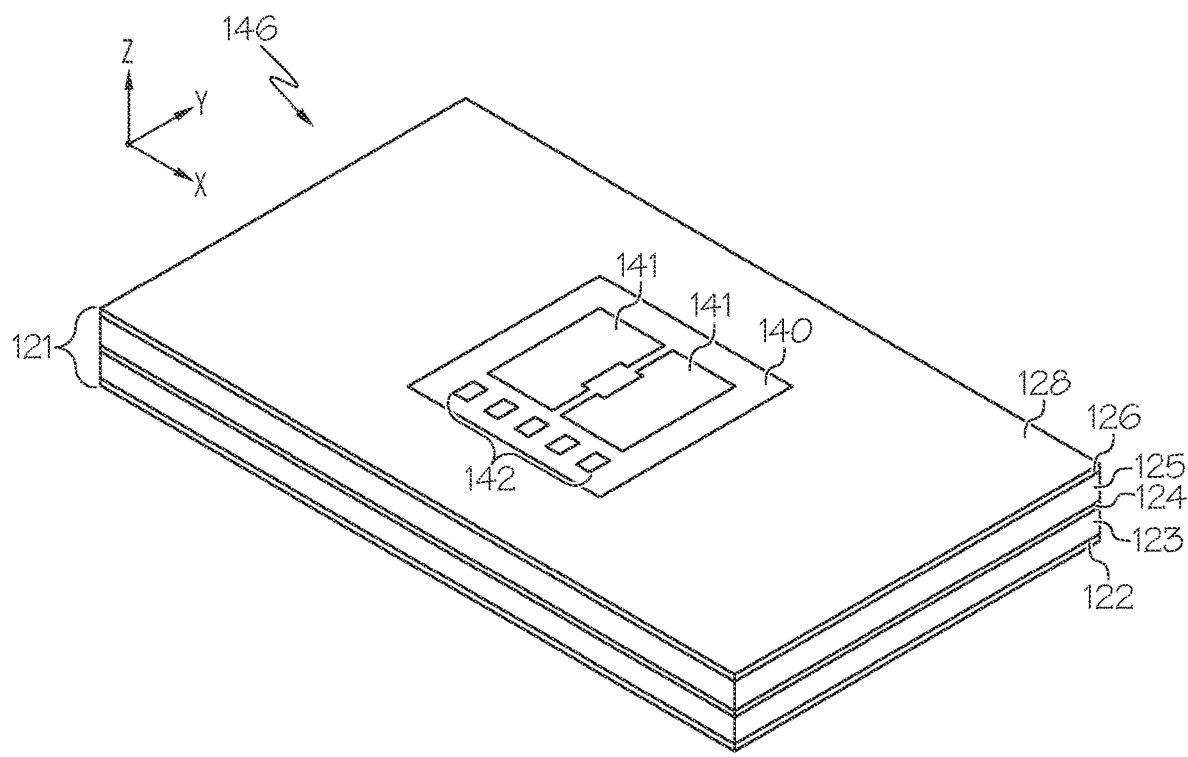
FIG. 7 schematically illustrates a top perspective view of the example power electronics device assembly illustrated by FIG. 6 according to one or more embodiments described and illustrated herein.

FIG. 6 illustrates a partial exploded view of a power electronics device assembly 146 comprising an S-cell 121 and a power electronics device 140. FIG. 6 depicts the power electronics device 140 and a bonding layer 143 with respect to the recess 127. FIG. 7 illustrates an assembled power electronics device assembly 146. The bonding layer 143 may be a solder layer, for example. As another example, the bonding layer 143 may be a transient liquid phase bonding layer 143. The power electronics device 140 includes a plurality of electrodes 141, 142 on its top surface. The large electrodes 141 may be power electrodes, while the smaller electrodes 142 may be signal electrodes. It is noted that, although not visible in FIG. 6, the power electronics device 140 further includes one or more electrodes on its bottom surface. The one or more electrodes on the bottom surface of the power electronics device are electrically connected to the second metal layer 126 by placement of the power electronics device 140 into the recess 127. Thus, electrical connection to the bottom electrodes of the power electronics device 140 may be made by way of the second metal layer 126.

Referring once again to FIG. 3, electrical connection to the plurality of electrodes 141, 142 and the second metal layer 126 may be made by a plurality of vias 112. These vias may provide drive signals to the power electronics devices 140, as well as provide a current path for switching current. It is noted that, in some embodiments, some of the vias 112 may be configured as thermal vias that do not conduct drive signals or switching current. For example, the vias 112 shown contacting the first metal layer 122 of the S-cells 121 may be thermally conductive-only vias that are provided to conduct heat flux toward a bottom layer that is close to the cold plate 102. Additionally, thermal vias 112 may be electrically coupled to edges of the second metal layer 126 to move heat flux from the second metal layer 126 down toward the cold plate 102. In this way, heat flux is optimally directed away from the power electronics devices 140 and toward the cold plate 102. As shown in FIG. 3, cold cooling fluid 135 enters the cold plate 102 through the fluid inlet 132, flows through the fluid chamber 115, and exits as warmed cooling fluid out of the fluid outlet 134.

It should now be understood that embodiments of the present disclosure are directed to circuit board assemblies, power electronics device assemblies, and power electronics assemblies comprising an S-cell that is fully embedded within a circuit board substrate. The S-cell of the embodiments described herein include internal first and second graphite layers to improve thermal performance, as well as an internal electrically isolating area that provides electrical isolation. The electrical isolation of the S-cell enables the removal of an electrical isolation layer between the circuit board and the cold plate. The embedding of the power electronics device assemblies directly into the circuit board, as well as the removal of a separate electrical isolation layer between the circuit board and the cold plate, significantly reduces the overall size of the power electronics assembly while also providing enhanced thermal performance.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:

1. A power electronics device assembly comprising:
an S-cell comprising:
a first metal layer;
a first graphite layer bonded to the first metal layer;
an electrically insulating layer bonded to the first graphite layer;
a second graphite layer bonded to the electrically insulating layer; and
a second metal layer bonded to the second graphite layer, the second metal layer comprising a surface and a recess provided within the surface; and
a power electronics device disposed within the recess of the surface.

2. The power electronics device assembly of claim 1, wherein the electrically insulating layer is made from silicon nitride.

3. The power electronics device assembly of claim 1, wherein the S-cell has a length that is greater than a width.

4. The power electronics device assembly of claim 1, further comprising:
a first active metal brazing layer between the first metal layer and the first graphite layer;
a second active brazing layer between the second graphite layer and the electrically insulating layer;
a third active metal brazing layer between the electrically insulating layer and the second graphite layer; and
a fourth active metal brazing layer between the second graphite layer and the second metal layer.

5. A circuit board assembly comprising:
a substrate that is electrically insulating;
a power electronics device assembly fully embedded in the substrate, the power electronics device assembly comprising:
an S-cell comprising:
a first metal layer;
a first graphite layer bonded to the first metal layer;
an electrically insulating layer bonded to the first graphite layer;
a second graphite layer bonded to the electrically insulating layer; and
a second metal layer bonded to the second graphite layer, the second metal layer comprising a surface and a recess provided within the surface; and
a power electronics device disposed within the recess of the surface.

6. The circuit board assembly of claim 5, further comprising a plurality of electrically conductive layers embedded within the substrate.

7. The circuit board assembly of claim 5, further comprising a plurality of thermal vias embedded in the substrate and thermally coupled to the power electronics device.

8. The circuit board assembly of claim 5, wherein the electrically insulating layer is made from silicon nitride.

9. The circuit board assembly of claim 5, wherein the S-cell has a length that is greater than a width.

10. The circuit board assembly of claim 5, wherein the S-cell further comprises:
a first active metal brazing layer between the first metal layer and the first graphite layer;
a second active metal brazing layer between the second graphite layer and the electrically insulating layer;
a third active metal brazing layer between the electrically insulating layer and the second graphite layer; and
a fourth active metal brazing layer between the second graphite layer and the second metal layer.

11. A power electronics assembly comprising:
a cold plate; and
a circuit board assembly affixed to a first surface of the cold plate, the circuit board assembly comprising:
a substrate that is electrically insulating;
a power electronics device assembly fully embedded in the substrate, the power electronics device assembly comprising:
an S-cell comprising:
a first metal layer;
a first graphite layer bonded to the first metal layer;
an electrically insulating layer bonded to the first graphite layer;
a second graphite layer bonded to the electrically insulating layer; and
a second metal layer bonded to the second graphite layer, the second metal layer comprising a surface and a recess provided within the surface; and
a power electronics device disposed within the recess of the surface.

12. The power electronics assembly of claim 11, wherein the circuit board assembly is affixed to the first surface of the cold plate by a bond layer.

13. The power electronics assembly of claim 11, wherein the circuit board assembly is affixed to the first surface of the cold plate by fasteners and a thermal grease layer.

14. The power electronics assembly of claim 11, further comprising a capacitor affixed to a second surface of the cold plate that is opposite from the first surface.

15. The power electronics assembly of claim 11, wherein;
the cold plate comprises a fluid chamber, a fluid inlet, and a fluid outlet; and
the fluid inlet and the fluid outlet are thermally coupled to the fluid chamber.

16. The power electronics assembly of claim 11, wherein the circuit board assembly further comprises a plurality of electrically conductive layers embedded within the substrate.

17. The power electronics assembly of claim 11, wherein the circuit board assembly further comprises a plurality of thermal vias embedded in the substrate and thermally coupled to the power electronics device.

18. The power electronics assembly of claim 11, wherein the electrically insulating layer is made from silicon nitride.

19. The power electronics assembly of claim 11, wherein the S-cell has a length that is greater than a width.

20. The power electronics assembly of claim 11, wherein the S-cell further comprises:
a first active metal brazing layer between the first metal layer and the first graphite layer;

a second active metal brazing layer between the second graphite layer and the electrically insulating layer;

a third active metal brazing layer between the electrically insulating layer and the second graphite layer; and a fourth active metal brazing layer between the second graphite layer and the second metal layer.

\* \* \* \* \*